United States Patent
Tsui et al.

(10) Patent No.: US 11,417,670 B2
(45) Date of Patent: Aug. 16, 2022

(54) STRUCTURE AND METHOD FOR SINGLE GATE NON-VOLATILE MEMORY DEVICE

(71) Applicant: Taiwan Semiconductor Manufacturing Company, Ltd., Hsin-Chu (TW)

(72) Inventors: Felix Ying-Kit Tsui, Cupertino, CA (US); Huang-Wen Tseng, Zhubei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 16/195,003

(22) Filed: Nov. 19, 2018

(65) Prior Publication Data

US 2019/0088666 A1   Mar. 21, 2019

Related U.S. Application Data

(63) Continuation of application No. 14/854,336, filed on Sep. 15, 2015, now Pat. No. 10,153,290, which is a
(Continued)

(51) Int. Cl.
*H01L 27/11524* (2017.01)
*H01L 27/11521* (2017.01)
(Continued)

(52) U.S. Cl.
CPC .. *H01L 27/11524* (2013.01); *H01L 27/11519* (2013.01); *H01L 27/11521* (2013.01);
(Continued)

(58) Field of Classification Search
CPC ............ H01L 29/0653; H01L 29/0847; H01L 29/7881
See application file for complete search history.

(56) References Cited

U.S. PATENT DOCUMENTS 6,294,811 B1   9/2001   Fong et al.
6,678,190 B2   1/2004   Yang et al.
(Continued)

OTHER PUBLICATIONS

Taiwan Patent Office, Taiwanese Office Action dated Aug. 19, 2015, Application No. 10-2015-0100396 filed Jul. 15, 2015. Translation included 16 pages.
(Continued)

*Primary Examiner* — Lauren R Bell
(74) *Attorney, Agent, or Firm* — Haynes and Boone, LLP

(57) ABSTRACT

The present disclosure provides an integrated circuit. The integrated circuit includes a substrate; a field effect transistor disposed in a periphery region of the substrate, the field effect transistor including a gate electrode, a first source, a first drain; a floating gate non-volatile memory device disposed in a memory region of the substrate, the floating gate non-volatile memory device including a second source, a third source, and a second drain, wherein the second source, the third source, and the second drain are disposed along an axis; and a floating gate electrode in the memory region including a first portion, a second portion, and a third portion, wherein the first portion, the second portion, and the third portion are electrically connected, wherein the first portion, the second portion and the third portion extend perpendicular to the axis.

20 Claims, 14 Drawing Sheets

Related U.S. Application Data continuation of application No. 13/184,823, filed on Jul. 18, 2011, now abandoned.

(51) Int. Cl.
| | |
|---|---|
| *H01L 27/11519* | (2017.01) |
| *H01L 27/11531* | (2017.01) |
| *H01L 27/11558* | (2017.01) |
| *H01L 29/788* | (2006.01) |
| *H01L 27/11529* | (2017.01) |
| *H01L 29/06* | (2006.01) |
| *H01L 29/08* | (2006.01) |
| *H01L 21/8238* | (2006.01) |

(52) U.S. Cl.
CPC .. *H01L 27/11529* (2013.01); *H01L 27/11531* (2013.01); *H01L 27/11558* (2013.01); *H01L 29/0653* (2013.01); *H01L 29/0847* (2013.01); *H01L 29/7881* (2013.01); *H01L 21/823814* (2013.01)

(56) References Cited

U.S. PATENT DOCUMENTS

| | | | |
|---|---|---|---|
| 6,974,989 | B1 | 12/2005 | Chen et al. |
| 7,099,192 | B2 | 8/2006 | Wang et al. |
| 7,289,361 | B2 | 10/2007 | Shukuri et al. |
| 7,388,777 | B2 | 6/2008 | Shiba et al. |
| 7,423,903 | B2 | 9/2008 | Lin et al. |
| 7,582,567 | B1 | 9/2009 | Syau et al. |
| 7,626,864 | B2 | 12/2009 | Wang |
| 7,812,389 | B2 | 10/2010 | Tanaka et al. |
| 7,859,043 | B2 | 12/2010 | Pikhay et al. |
| 7,983,081 | B2 | 7/2011 | Leung et al. |
| 8,304,309 | B2 | 11/2012 | Bicksler |
| 2007/0170489 | A1* | 7/2007 | Fang .................. H01L 27/115 257/314 |
| 2007/0241383 | A1 | 10/2007 | Lin et al. |
| 2009/0213660 | A1* | 8/2009 | Pikhay .............. G11C 16/0441 365/185.18 |
| 2010/0188901 | A1 | 7/2010 | Pikhay et al. |
| 2011/0121379 | A1* | 5/2011 | Pikhay .............. G11C 16/0441 257/315 |
| 2016/0005751 | A1 | 1/2016 | Tsui et al. |

OTHER PUBLICATIONS

Taiwan Patent Office, Taiwanese Office Action dated Nov. 6, 2014, Application No. 10-2012-0012880 filed Feb. 8, 2012. Translation included 16 pages.

Sze et al., "Physics of Semiconductor Devices" 3$^{rd}$ Ed. Hoboken, NJ, John Wiley & Sons, Inc. 2007. 294-295. Print.

* cited by examiner

US 11,417,670 B2

STRUCTURE AND METHOD FOR SINGLE GATE NON-VOLATILE MEMORY DEVICE

CROSS-REFERENCE TO RELATED APPLICATIONS

This application is a continuation of U.S. patent application Ser. No. 14/854,336 filed on Sep. 15, 2015, which is a continuation of U.S. patent application Ser. No. 13/184,823 filed on Jul. 18, 2011, each of which is hereby incorporated by reference in its entirety.

BACKGROUND

In deep sub-micron integrated circuit technology, non-volatile memory device has become a popular storage unit due to various advantages. Particularly, the data saved in the non-volatile memory device are not lost when the power is turned off. One particular example of the non-volatile memory device includes a single floating gate to retain the electrical charges associated with the saved data. When complementary metal-oxide-semiconductor field effect transistor (CMOSFET) technology is implemented, salicide is formed on various contact regions, such as gate, source and drain, to reduce the contact resistance. When the integrated circuit including non-volatile memory device is scaled down through various technology nodes, the design of the memory device have a consideration of the process integration, such as alignment margin and other factors, leading to large memory cell size and low packing density. Therefore, a structure of the single non-volatile memory device and a method making the same are needed to address the above issue.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
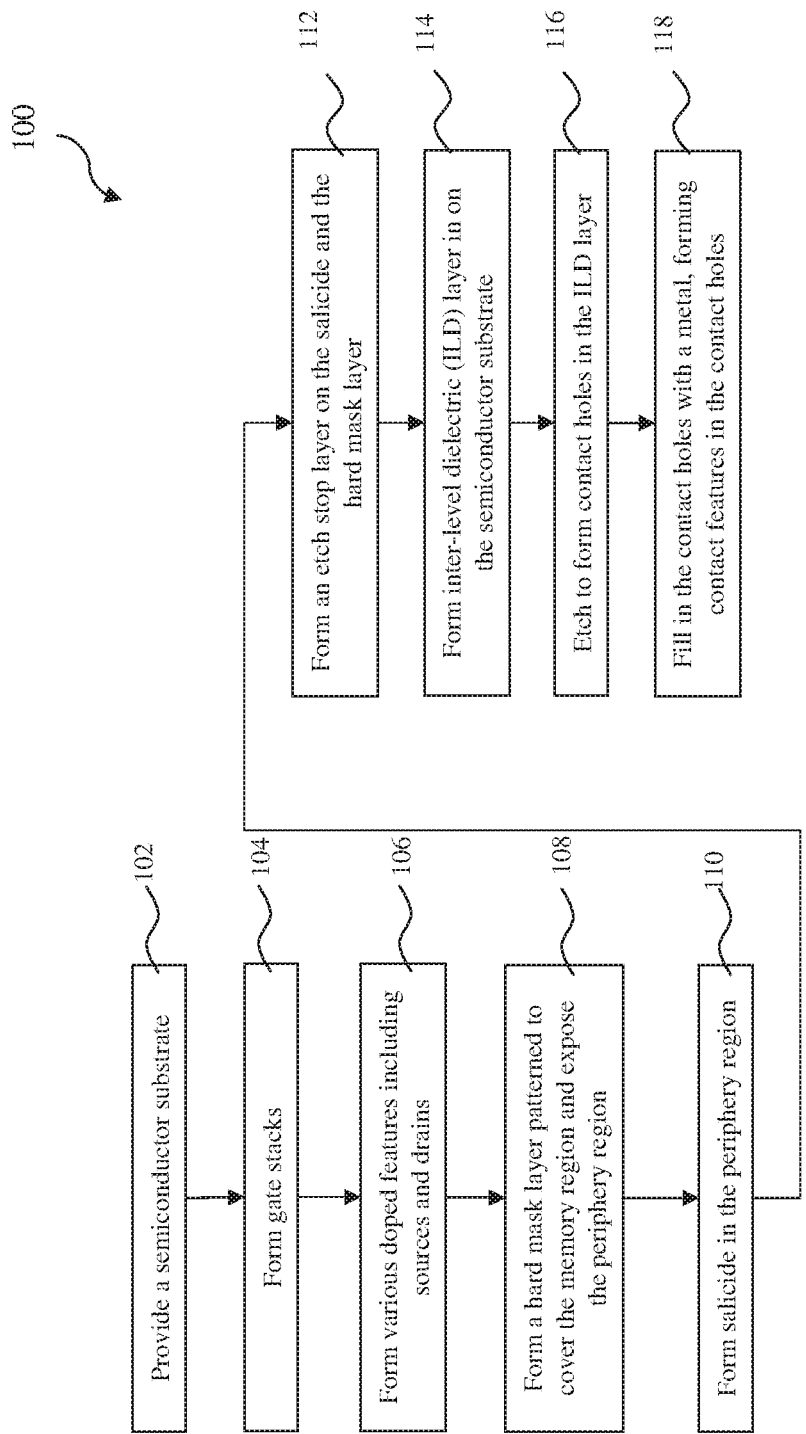
FIG. 1 is a flowchart of a method making a semiconductor device having metal gate stacks and polysilicon structures constructed according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of an embodiment of a method 100 making a semiconductor device having a single floating gate non-volatile memory device constructed according to various aspects of the present disclosure. FIGS. 2 through 6 are sectional views of a semiconductor structure 200 at various fabrication stages and constructed according to one or more embodiments. The semiconductor structure 200 and the method 100 of making the same are collectively described with reference to FIGS. 1 through 6.

Figure 2:
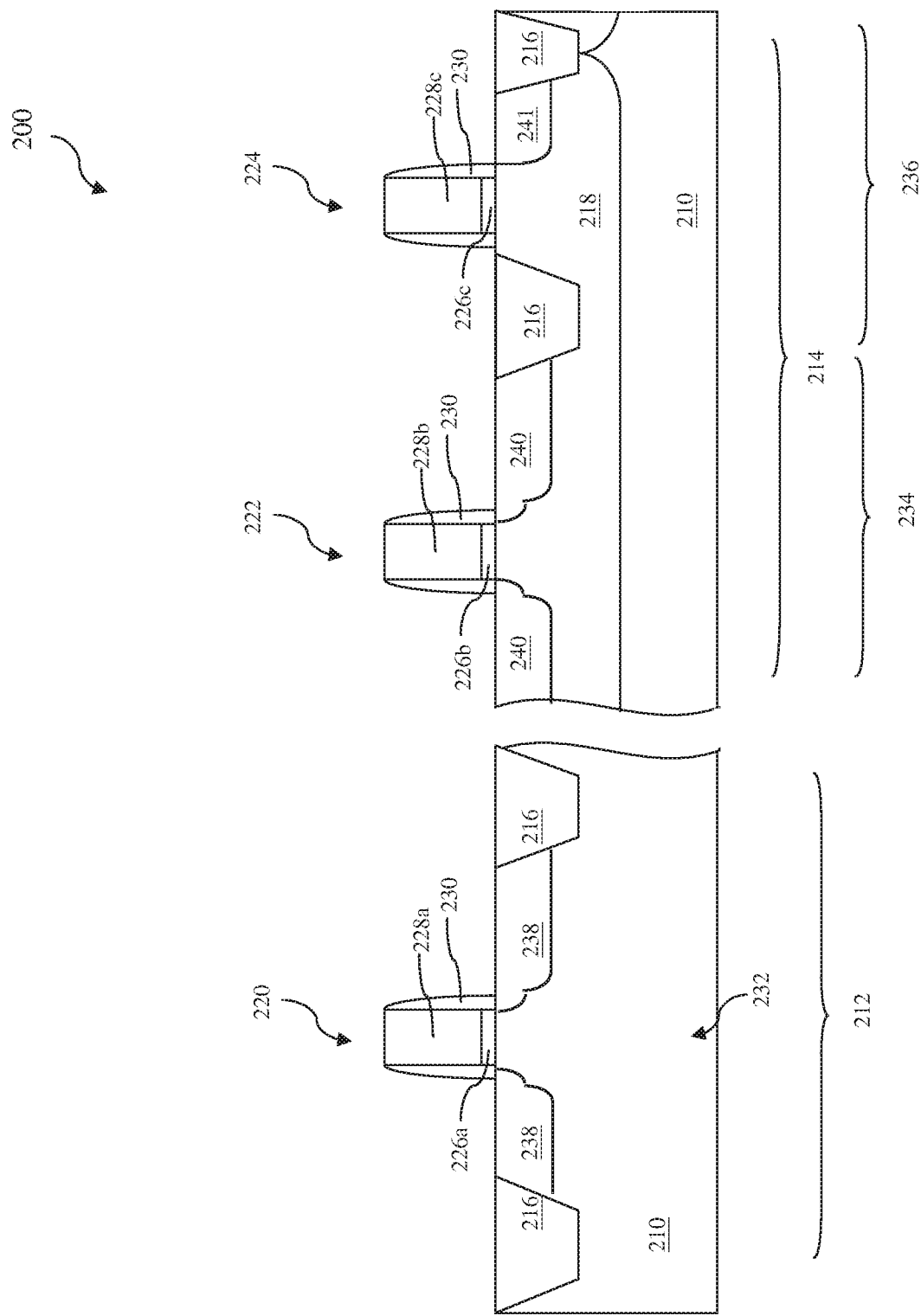
FIGS. 2-6 are sectional views of one embodiment of a semiconductor structure having single floating gate non-volatile memory device at various fabrication stages constructed according to various aspects of the present disclosure.

Referring to FIGS. 1 and 2, the method 100 begins at step 102 by providing a semiconductor substrate 210. The semiconductor substrate 210 includes silicon. Alternatively or additionally, the substrate includes germanium, silicon germanium or other proper semiconductor materials. The semiconductor substrate 210 also includes various isolation features such as shallow trench isolation (STI) formed in the substrate to separate various devices. The semiconductor substrate also includes various doped regions such as n-well and p-wells. In one embodiment, the semiconductor substrate 210 includes a periphery region 212 for periphery devices and a memory region 214 for single floating gate non-volatile memory devices. Various shallow trench isolation feature 216 are formed in the semiconductor substrate 210 and are configured in the periphery region 212 and the memory region 214 for proper electrical isolation. The formation of the STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure. In another embodiment, the semiconductor substrate 210 in the memory region 214 includes a doped well 218, such as an n-type doped well in one example.

The method 100 proceeds to step 104 by forming a first gate stack 220 in the periphery region 212 and a second gate stack 222 and a third gate stack 224 in the memory region 214. In one embodiment, the first, second and third gate stacks 220/222/224 are simultaneously formed in a same processing procedure. The first gate stack 220 includes a first gate dielectric feature 226a and a first gate electrode 228a stacked on the first gate dielectric feature. Similarly, the second gate stack 222 includes a second gate dielectric feature 226b and a second gate electrode 228b stacked on the second gate dielectric feature, the third gate stack 224 includes a third gate dielectric feature 226c and a third gate electrode 228c stacked on the third gate dielectric feature.

In the present embodiment, various material layers, including a gate dielectric layer 226 and a gate electrode layer 228 are formed on the substrate 210 by various deposition technique. Then a lithography patterning process is applied to the various material layers to pattern thereof, forming the first, second and third gate stacks 220/222/224 including respective gate dielectric features (226a, 226b and 226c) and gate electrodes (228a, 228b and 228c). In one example, the gate dielectric layer 226 includes silicon oxide and the gate electrode layer 228 includes doped polysilicon. In another example, the gate dielectric layer 226 of silicon oxide is formed by a thermal oxidation process and the gate electrode layer 228 of polysilicon is formed by a chemical vapor deposition (CVD) method. An exemplary lithography patterning process may include photoresist patterning, etching, and photoresist stripping. The photoresist patterning may further include processing steps of photoresist coating, soft baking, mask aligning, exposing pattern, post-exposure baking, developing photoresist, and hard baking. Lithography patterning may also be implemented or replaced by other proper methods such as maskless photolithography, electron-beam writing, ion-beam writing, and molecular imprint.

In one embodiment, various gate stacks may further include gate spacers (or sidewall spacers) 230 disposed on the sidewalls of the corresponding gate electrodes and are formed at a later step.

In an alternative embodiment, the first gate stack 220 can be formed separately in a different procedure such that the first gate stack 220 are configured differently from the second and third gate stacks 222/224. For example, the first gate dielectric feature may have a different dielectric material and/or a different thickness from those of the second and third gate dielectric features.

In another alternative embodiment, the gate dielectric 226 may include a high-k dielectric layer. The high k dielectric layer includes a dielectric material having the dielectric constant higher than that of thermal silicon oxide, about 3.9. In one example, the high-k dielectric layer includes hafnium oxide (HfO). In various examples, the high-k dielectric layer includes metal oxide, metal nitride, or combinations thereof. In one embodiment, the gate electrode layer 228 includes metal, such as copper, aluminum or other suitable metal. In another embodiment, the gate stacks (e.g. 220, 222 and 224) may further include a conductive layer interposed between the high-k dielectric layer and gate electrode layer. In one example, the conductive layer includes titanium nitride (TiN).

In one embodiment, the gate stack 220 is configured for a first transistor 232, such as a field-effect transistor (FET). In one example, the first transistor 232 include a metal-oxide-semiconductor FET (MOSFET) such as n-type MOSFET or p-type MOSFET. The second gate stack 222 is formed for a second transistor 234. In another embodiment, the third gate stack 224 is formed for a capacitor 236. The second transistor 234 and the capacitor 236 are electrically coupled and configured to form a single floating gate non-volatile memory cell (or device). Particularly, the second gate electrode 228b in the second gate stack 222 is configured to be electrically floating. There is no control gate directly stacked on the floating gate 228b. The capacitor 236 is coupled with the floating gate 228b and further functions to control various operations to the memory cell. As illustrated in FIG. 2, the second gate stack 222 and the third gate stack 224 are disposed at different areas of the semiconductor substrate 210 and are laterally distanced from each other. In this particular example, the second gate stack 222 and the third gate stack 224 are laterally separated by a STI feature 216.

The method 100 proceeds to step 106 by forming various doped features in the semiconductor substrate 210, including sources and drains in the periphery region 212 and the memory region 214. The source and drain 238 are formed for the first transistor 232 by a proper technique, such as one or more ion implantations. Similarly, source and drain 240 in the second transistor 234 are formed by a same process to form the source and drain 238 when both are same type (n-type or p-type) MOSFETs. Alternatively, the source and drain 240 in the second transistor 234 are separately formed by similar technique when sources/drains 238 and 240 are different type (one is n-type and another is p-type) MOSFETs. In one embodiment, the source and drain features (238 and 240) further include light doped source/drain (LDD) features substantially aligned with the associated gate stack and heavily doped source/drain (S/D) features substantially aligned with associated sidewall spacers 230. In furtherance of the embodiment, taking the floating gate transistor 234 as an example, the LDD features are formed first by ion implantation with a light doping dose. Thereafter, the spacer 230 is formed by dielectric deposition and plasma etching. Then the heavily doped S/D features are formed by ion implantation with a heavy doping dose. The various source and drain features of an nFET and a pFET can be formed in a similar procedure but with opposite doping type.

The doping type of the source/drain 238 is opposite from the doping type of the semiconductor substrate 210 such that the first transistor 232 is properly configured. As to the floating gate transistor 234, the doping type of the doped well 218 includes a first type of dopant and the source/drain 240 includes a second type of dopant opposite from the first type of dopant. In the present embodiment, the doped well 218 includes p-type dopant (p-well) and the source/drain 240 include n-type dopant, the corresponding floating gate transistor 234 is a n-type transistor (nFET).

Particularly, doped region 241 is also formed in the capacitor 236. In the present embodiment, the doped region 241 is similar to the source/drain 240 and includes the second type of dopant different from the first type of dopant in the doped well 218. The doped region 241 is disposed at the edge of the gate stack 224 at one side. The doped region 241 contacts the doped well 218 or disposed in the doped well 218. Alternatively, the doped region 241 is disposed on the both sides of the gate stack 224. In another alternative embodiment, the doped region 241 includes the first type of dopant in the doped well. In yet another embodiment, the doped region 241 is simultaneously in the same ion implantation procedure to form the source/drain 240. For example, the doped region 241 may include a light doped feature and a heavily doped feature of the same type dopant, similar to the LDD and heavily doped source/drain 240. The doped well 218 serves as one capacitor electrode and the third gate electrode 228c is another capacitor electrode. The gate dielectric feature 226c is the capacitor dielectric sandwiched between the two capacitor electrodes.

Figure 3:
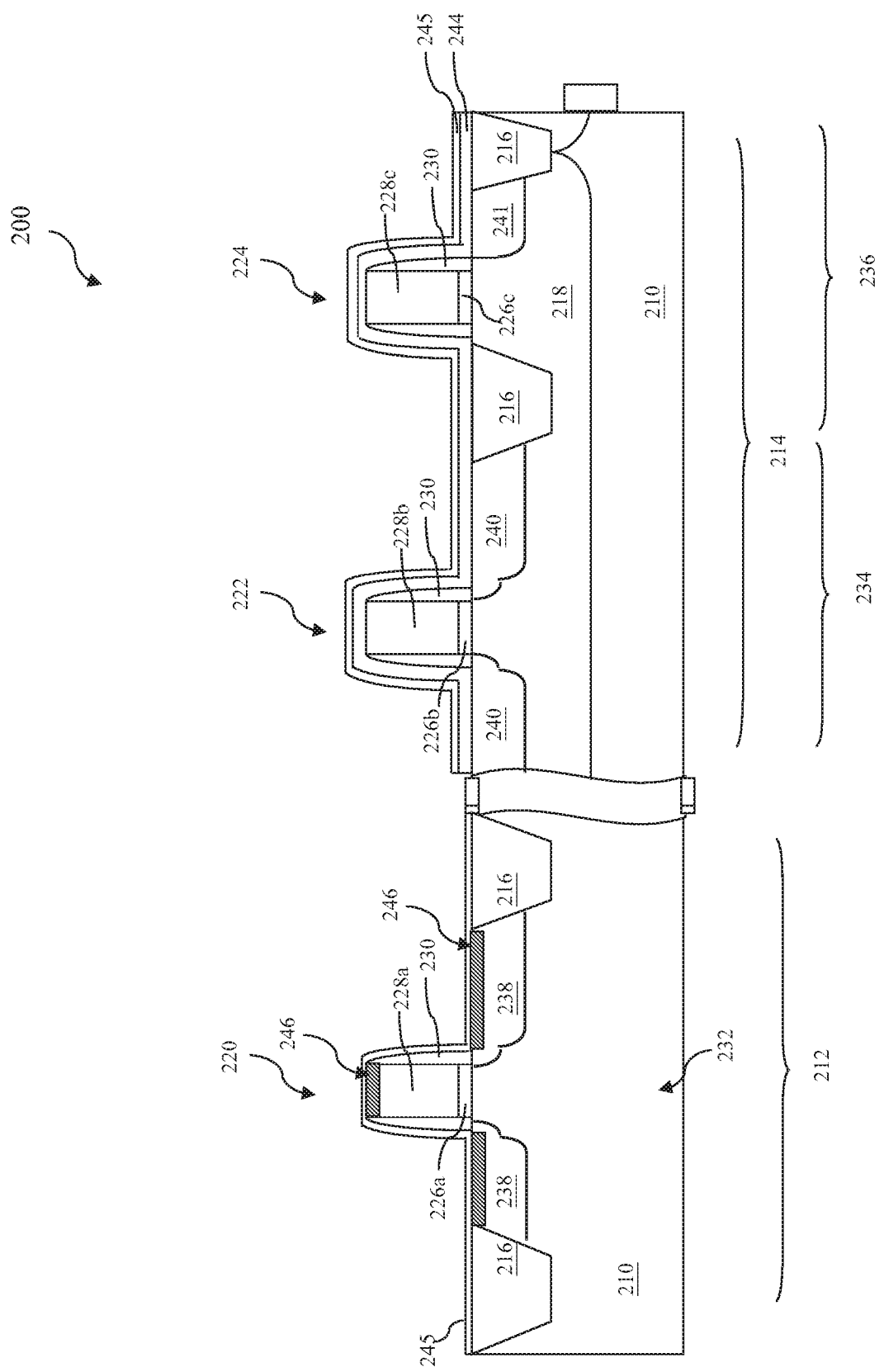

Referring to FIG. 3, the method 100 proceeds to step 108 by forming hard mask layer 244 patterned to substantially cover the memory region 214 while the periphery region 212 is exposed to subsequent silicide formation. Particularly, the source and drain 238 are exposed for the silicide formation. Additionally, the first gate electrode 228a may be also exposed for silicide formation. The hard mask layer 244 includes various openings and is used for the subsequent silicide formation. In one embodiment, the hard mask layer 244 includes openings, as illustrated in FIG. 3, to expose the gate stack 222 and the source/drain 238 in the periphery region 212. The formation of the hard mask layer 244 includes deposition and lithography patterning. The lithography patterning includes forming a patterned photoresist layer on the hard mask layer and etching the hard mask layer through the openings of the patterned photoresist layer. In one example, the hard mask layer 244 includes silicon oxide formed by a CVD, such as plasma enhanced CVD (PECVD). In another embodiment, the etching process applied to the hard mask layer includes a hydrofluoric acid as the etchant to selectively remove the hard mask layer within the openings of the patterned photoresist layer. The patterned photoresist layer may be removed thereafter by wet stripping or plasma ashing. The hard mask layer 244 may include other suitable material such as silicon nitride according to another embodiment. In one example, the silicon nitride hard mask layer can be formed by a suitable technique, such as PECVD. In one example, the thickness of the hard mask layer 244 ranges between about 200 angstrom and about 1200 angstrom.

Still referring to FIG. 3, the method 100 proceeds to step 110 by forming various silicide features 246 in the periphery region 212 while the memory region 214 is protected by the hard mask from forming silicide. The silicide features 246 are formed by a process known in the art such as self-aligned silicide (salicide) and therefore also referred to as salicide features 246. In one embodiment, the silicide features 246 include nickel silicide. In an alternative embodiment, the silicide features include 246 may include other suitable silicide, such as cobalt silicide, tungsten silicide, tantalum silicide, titanium silicide, platinum silicide, erbium silicide, palladium silicide, or combinations thereof. In one example, the silicide has a thickness ranging between about 200 angstrom and about 800 angstrom.

The silicide features 246 are formed on the source/drain 238 and may additionally formed on the first gate electrode 228a if the gate 228a includes polysilicon. In the present embodiment, the silicide features 246 are selectively formed in the periphery region by utilizing the hard mask layer 244 patterned to cover the memory region 214. In one example, a metal layer is deposited on the hard mask layer 244 and on various contact regions (source/drain 238 and gate electrode 228a) of the semiconductor substrate 210 in the periphery region 212 aligned with the openings of the hard mask layer 244. A high temperature annealing is applied to the semiconductor substrate 210 and the metal layer such that the metal layer is reacted with silicon of the substrate 210 to form silicide. The un-reacted metal layer is then removed by an etching process, resulting the silicide features 246 as illustrated in FIG. 3. Another annealing process with a higher annealing temperature may be further implemented to turn the silicide features 246 into a phase of low resistivity. The hard mask layer 244 may stay after the formation of the silicide features 244.

Referring to FIG. 3B, in various embodiments, the method 100 may proceed to step 112 by forming an etch stop layer 245 on the silicide features 246 and the hard mask layer 244. The etch stop layer 245 includes a dielectric material chosen to have etch selectivity for proper etch process at subsequent stages. The etch stop layer 245 may be conformal to the surface profile of the semiconductor substrate 210 such that the etch stop layer 245 substantially covers various features on the substrate 210.

Figure 4:
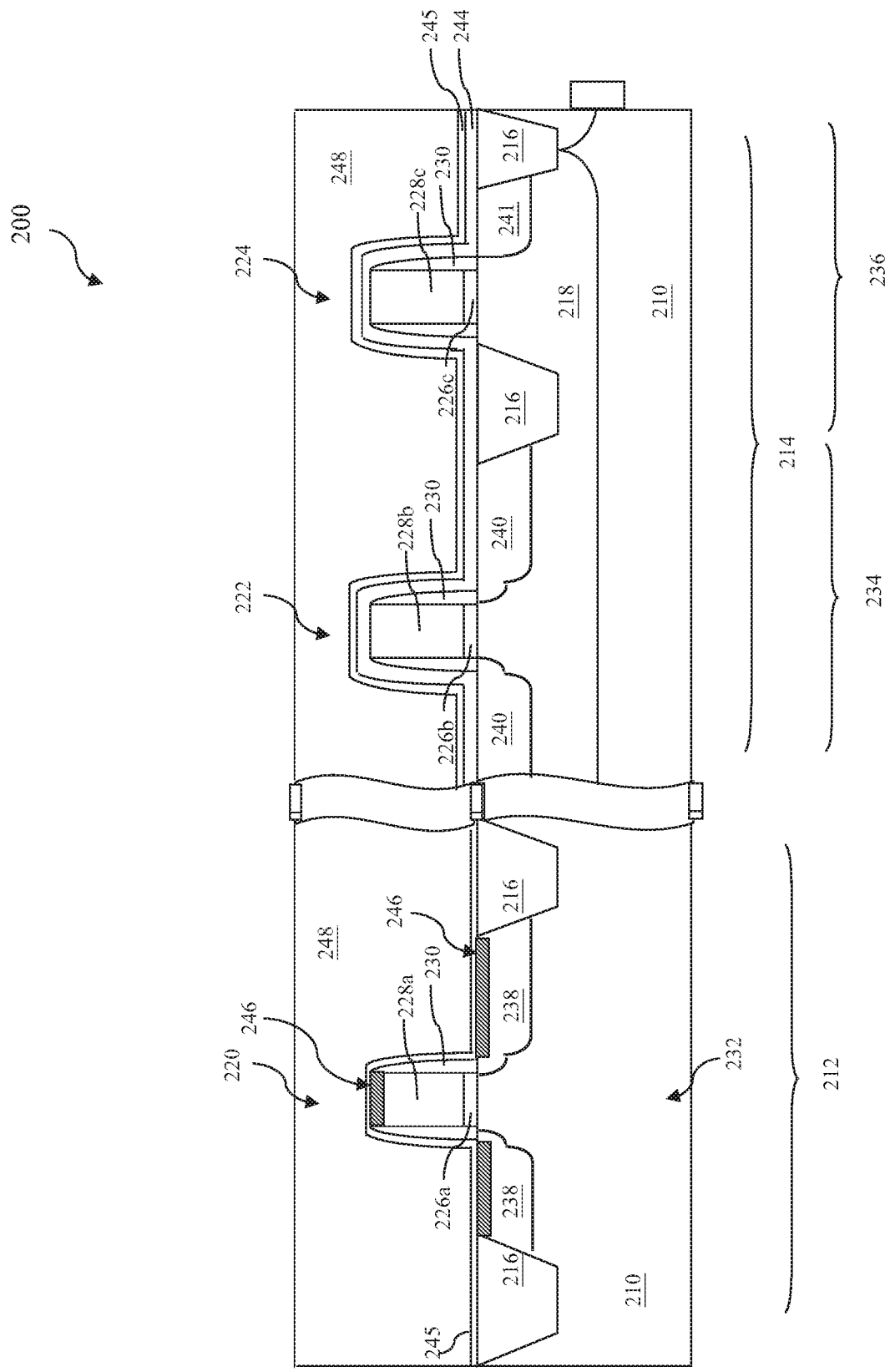

Referring to FIG. 4, the method 100 proceeds to step 114 by forming an inter-level dielectric (ILD) layer 248 on the semiconductor substrate 210 and the gate stacks 220/222/224. The ILD layer 248 is formed by a suitable technique, such as chemical vapor deposition (CVD). For example, a high density plasma CVD can be implemented to form the ILD layer 248. The ILD layer 248 is formed on the substrate to a level above the top surface of the gate stacks 220/222/224 such that the gate stacks 220/222/224 are embedded in. In various embodiments, the ILD layer 248 includes silicon oxide, low-k dielectric material (dielectric material with dielectric constant less than about 3.9, the dielectric constant of the thermal silicon oxide). In various embodiments, the low-k material includes fluorinated silica glass (FSG), carbon doped silicon oxide, BLACK DIAMOND® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials available or future developed.

In one embodiment, a chemical mechanical polishing (CMP) process is further applied to the ILD layer 248 to planarize the top surface of the ILD layer 248. In another embodiment, the CMP process may further reduce the thickness of the ILD layer 248 such that the gate stacks 220/222/242 are exposed from the top side. The processing conditions and parameters of the CMP process, including slurry chemical and polishing pressure, can be tuned to partially remove and planarize the ILD layer 248.

Figure 5:
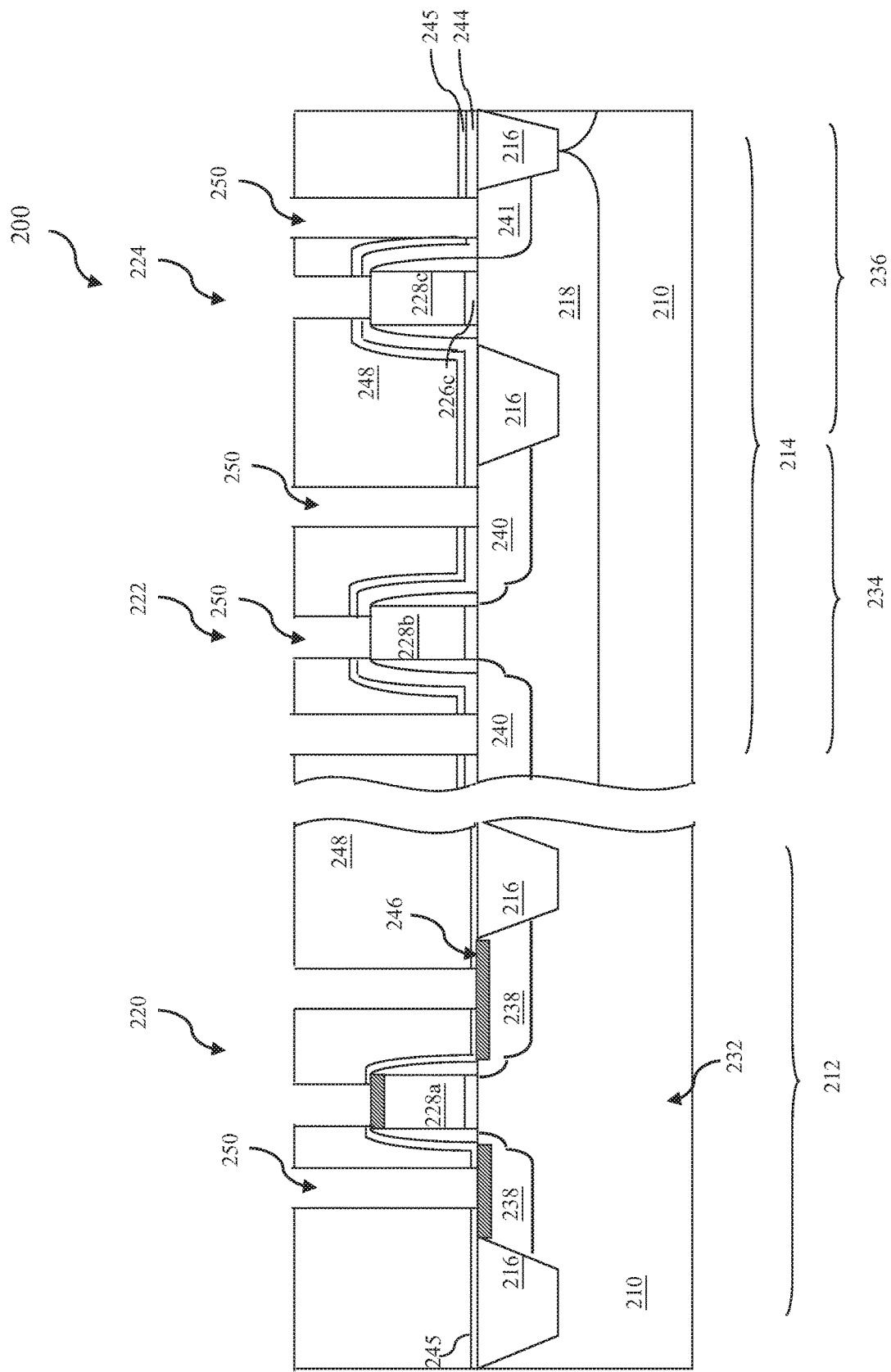

Referring to FIG. 5, the method 100 proceeds to step 116 by forming a plurality of contact holes 250 in the ILD layer 248 and aligned with various contact regions including the silicide features 246 in the periphery region 212 and the source/drain 240 and the doped region 241 in the memory region 214 such that those contact regions are exposed. In another example, a subset of the contact holes 250 may be formed and aligned with the gate stacks (e.g., 220, 222 and 224). The contact holes 250 are formed by a lithography process and an etching process including one or more etching steps. The etching process is applied to etch the ILD layer 248 and the hard mask layer 244 to expose the contact regions. In one embodiment, the etching process includes an etch step using a plasma etch with a suitable etchant, such as fluorine-containing etchant, to selectively etch the ILD layer 248 and the hard mask layer 244 without damaging to the silicide features in the periphery region 212. In one example, the etch process uses plasma etch with as including C5F8, CH2F2 and Ar. In furtherance of the example, the gas flows for C5F8, CH2F2 and Ar are tuned in ranges about 2 sccm~30 sccm, 5 sccm~40 sccm, and 100 sccm~600 sccm, respectively. In another embodiment, the etching process includes a first etch step (such as plasma etch) to etch the ILD layer 248 and a second etch step using a wet etch with a suitable etchant, such as HF, to selectively remove the hard mask layer 244 in the memory region 214 without damaging the silicide features 246 in the periphery region 212.

Alternatively, if the etch stop layer 245 is present, the second etch step is tuned to selectively remove both the etch stop layer 245 and the hard mask layer 244 without damaging to the silicide features 246. In a particular example, the second etch step is tuned such that etch rates to the hard mask layer 244 and the etch stop layer 245 are substantially same. In another embodiment, the etch stop layer 245 is chosen to be different from the ILD layer 248 and different from the hard mask layer 244. For example, the ILD layer 248 includes silicon oxide or low-k dielectric material and the hard mask layer 244 includes silicon oxide while the etch stop layer 245 includes silicon nitride or silicon carbide.

Figure 6:
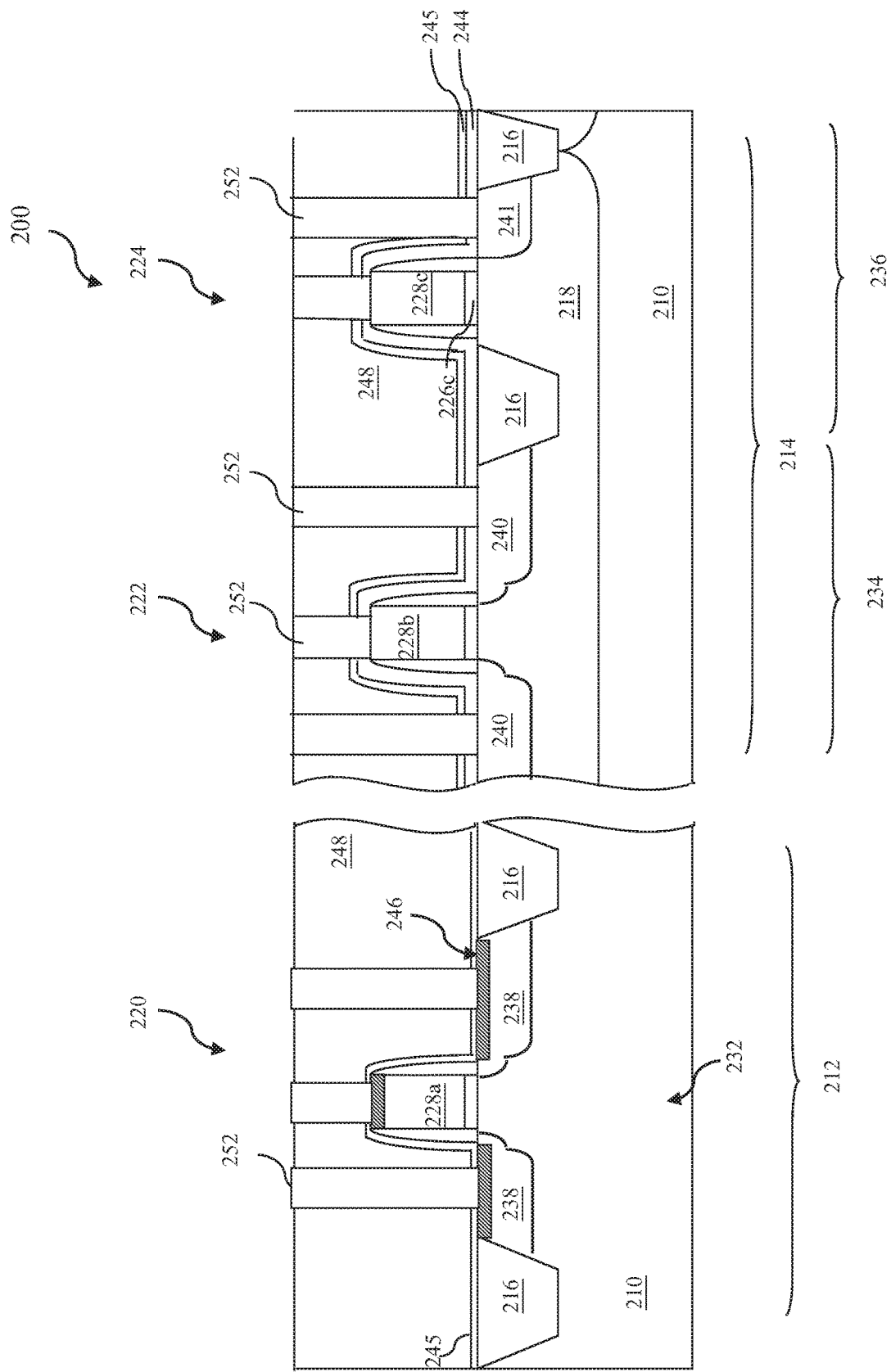

Referring to FIG. 6, the method 100 proceeds to step 118 by forming filling the contact holes 250 with one or more metal, resulting contact features or metal plugs. In one embodiment, tungsten is used to fill in the contact holes to form tungsten plugs 252. Other metal, such as copper or aluminum, can be used to form metal plugs 252. The metal deposition can use physical vapor deposition (PVD), plating or combination thereof. Another CMP process may be applied to remove excessive metal layer formed on the ILD layer and to further planarize the top surface of the semiconductor structure 200.

Figure 7:
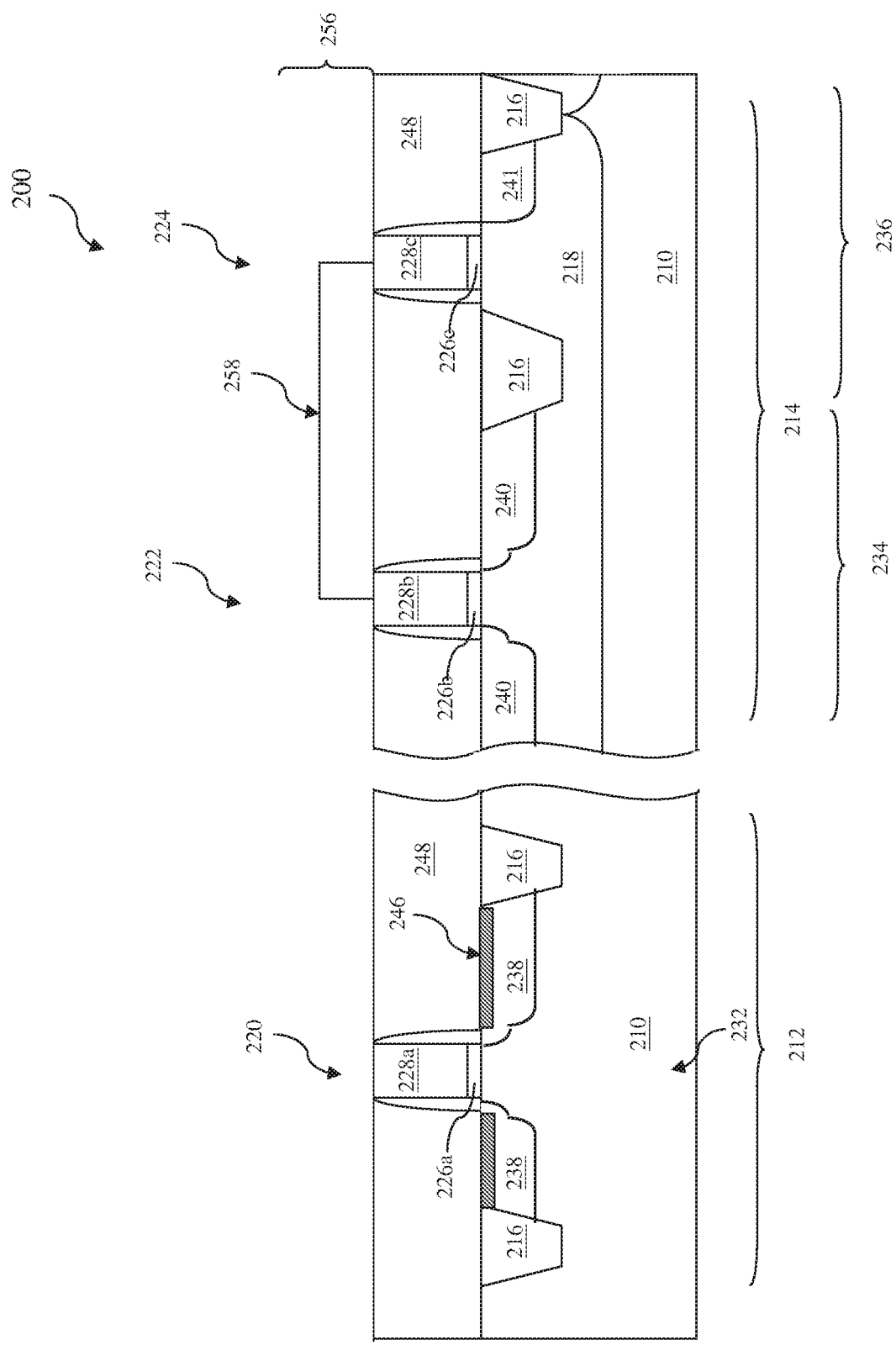
FIGS. 7-10 are sectional views of a semiconductor structure having single floating gate non-volatile memory device constructed according to various embodiments of the present disclosure.

FIG. 7 illustrates a sectional view of the semiconductor structure 200 having a floating gate non-volatile memory device constructed according to another embodiment. The floating gate non-volatile memory device includes a floating gate transistor 234 and a capacitor 236 electrically coupled together. The third gate electrode 228c of the capacitor 236 is electrically connected with the second gate electrode 228b of the floating gate transistor 234. Particularly, an interconnect structure 256 is formed on the semiconductor substrate 210 on both the periphery region 212 and the memory region 214. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes. Various contact holes are not shown in FIG. 7 for simplicity. The interconnect structure 256 includes various features 258 configured to electrically connect the gate electrodes 228b and 228c and further configured such that the gate electrodes 228b and 228c are electrically floating (not operable and accessible to voltage bias). Alternatively, the silicide features 246 may not be present on the first gate electrode 228a in the periphery region 212.

Although the semiconductor structure 200 and the method 100 are described, other alternatives and embodiments can be present without departure from the scope of the present disclosure. For example, the single floating gate non-volatile memory device in the memory region 214 may have other suitable structures according to various other embodiments and further provided below.

Figure 8:
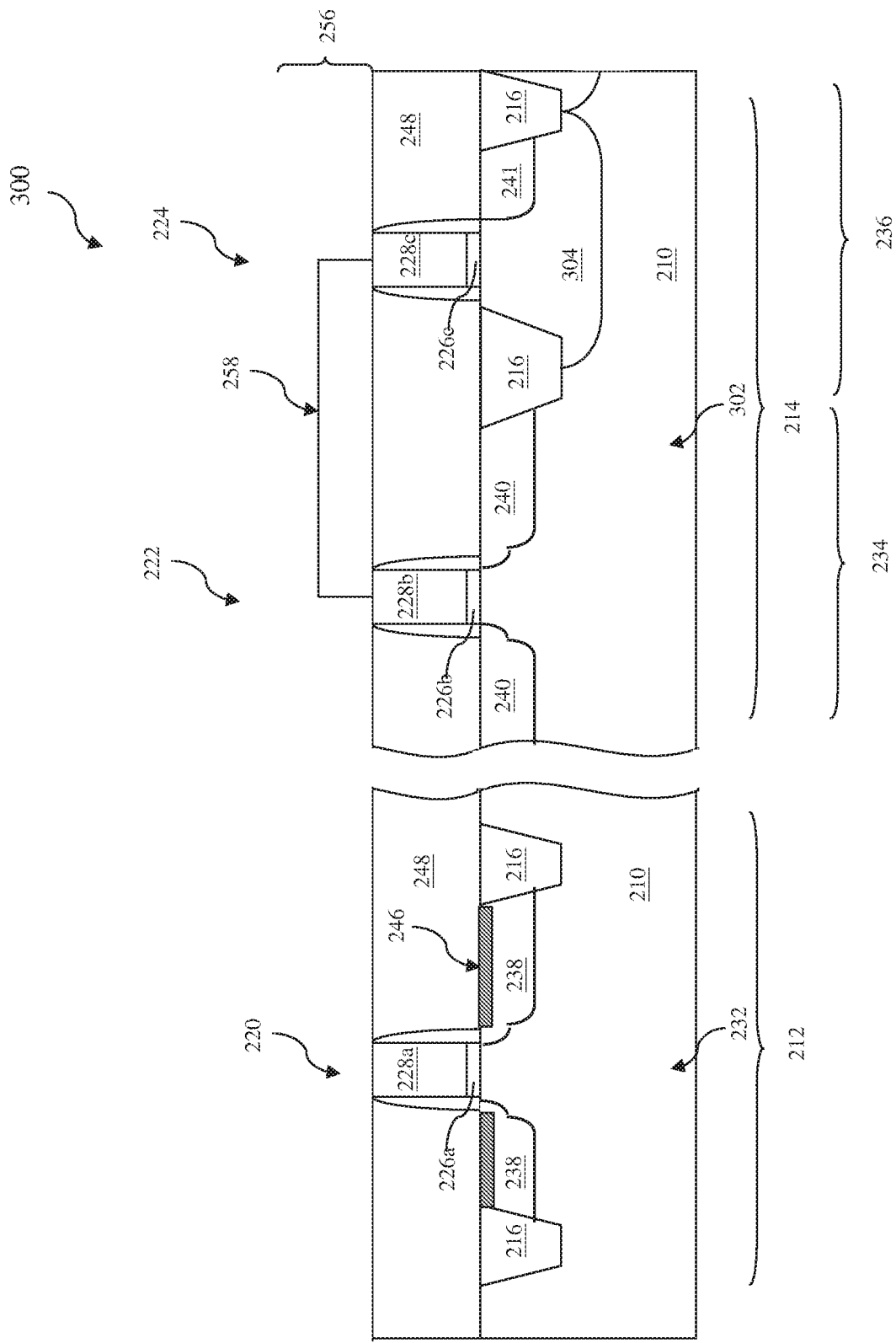

FIG. 8 illustrates another embodiment of a sectional view of a semiconductor structure 300 having a single floating gate non-volatile memory device 302. The semiconductor structure 300 is similar to the semiconductor structure 200 as the single floating gate non-volatile memory device 302 in the memory region 214 is free of silicide. The silicide features 246 are formed on the first transistor 232 in the periphery region 212 for enhanced device performance. However, the semiconductor structure 300 includes a doped well 304 as one capacitor electrode of the capacitor 236. The doped region 241 and the doped well 304 include same type of dopants, such as both being n-type or both being p-type. In the present embodiment, the semiconductor substrate 210 is p-type doped. The doped well 304 is n-type doped. The source/drain 240 and the doped region 241 are n-type doped. Particularly, the doping concentration of the doped region 241 is greater than that of the doped well 304 to reduce the voltage drop therebetween when a bias is applied to the doped region 241.

Figure 9:
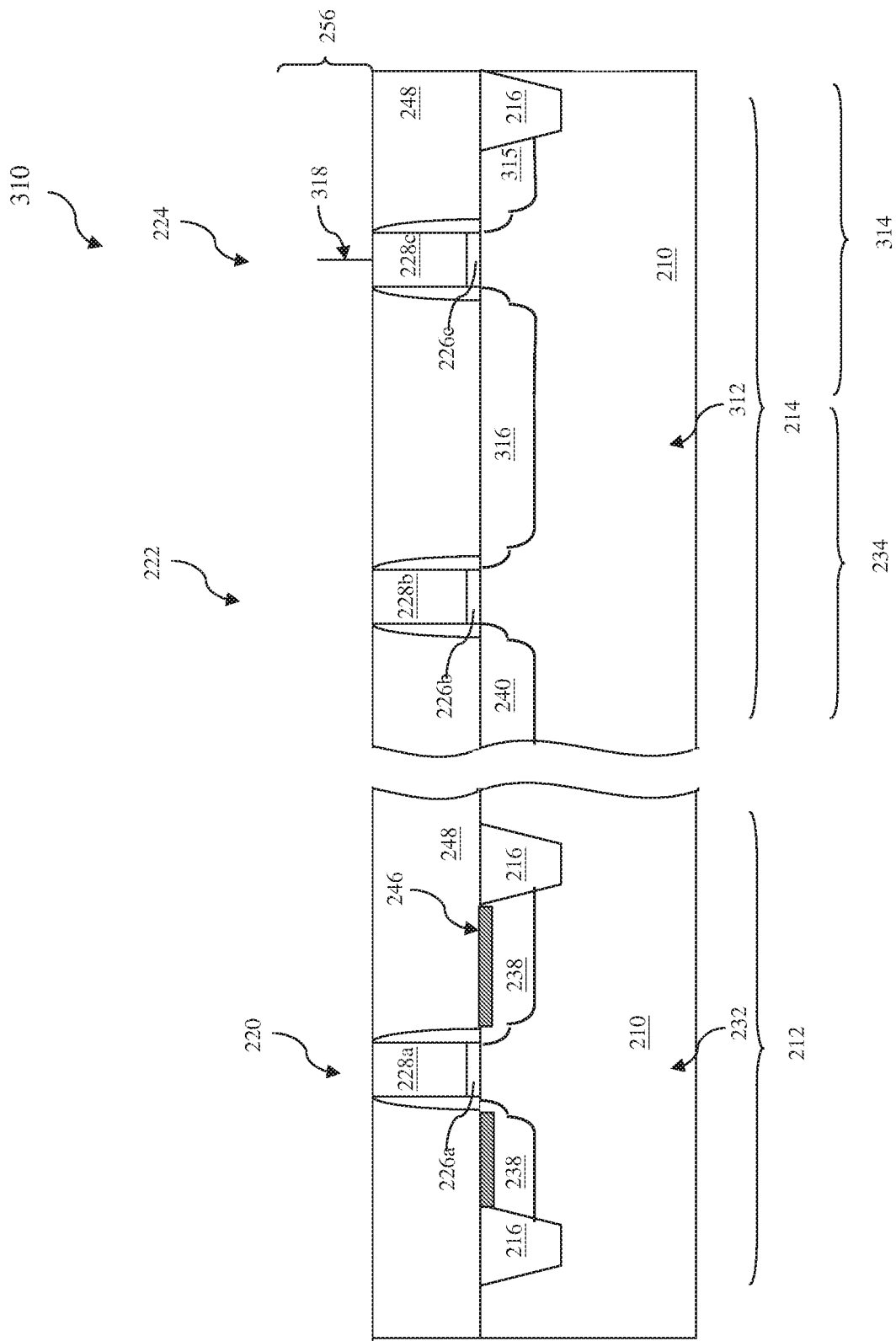

FIG. 9 illustrates another embodiment of a sectional view of a semiconductor structure 310 having a single floating gate non-volatile memory device 312. The semiconductor structure 310 is similar to the semiconductor structure 200 as the single floating gate non-volatile memory device 312 in the memory region 214 is free of silicide. The silicide features 246 are formed on the first transistor 232 in the periphery region 212 for enhanced device performance. However, the single floating gate non-volatile memory device 312 includes a floating gate transistor 234 and another transistor 314 integrated together. The transistor 314 includes a source 315 and a drain 316 disposed on the both side of the gate stack 224. Particularly, the floating gate transistor 234 and the transistor 314 are electrically coupled by sharing the common drain 316 interposed between the gate stacks 222 and 224. The common drain 316 and the sources 240 and 315 can be formed simultaneously in a same procedure. In the present embodiment, the semiconductor substrate 210 includes a type of dopant opposite from the type of dopant in the sources 240/315 and the common drain 316. Furthermore, the interconnect structure 256 includes various conductive features 318 configured to couple the gate electrode 228c of the transistor 314 to an input for proper voltage bias. Comparably, the gate electrode 228b is configured to be electrically floating while the gate electrode 228c is configured to be electrically biased. In another example, the single floating gate non-volatile memory device 312 may be formed in a doped well with a type dopant opposite from the sources (240 and 315) and the common drain 316.

Figure 10:
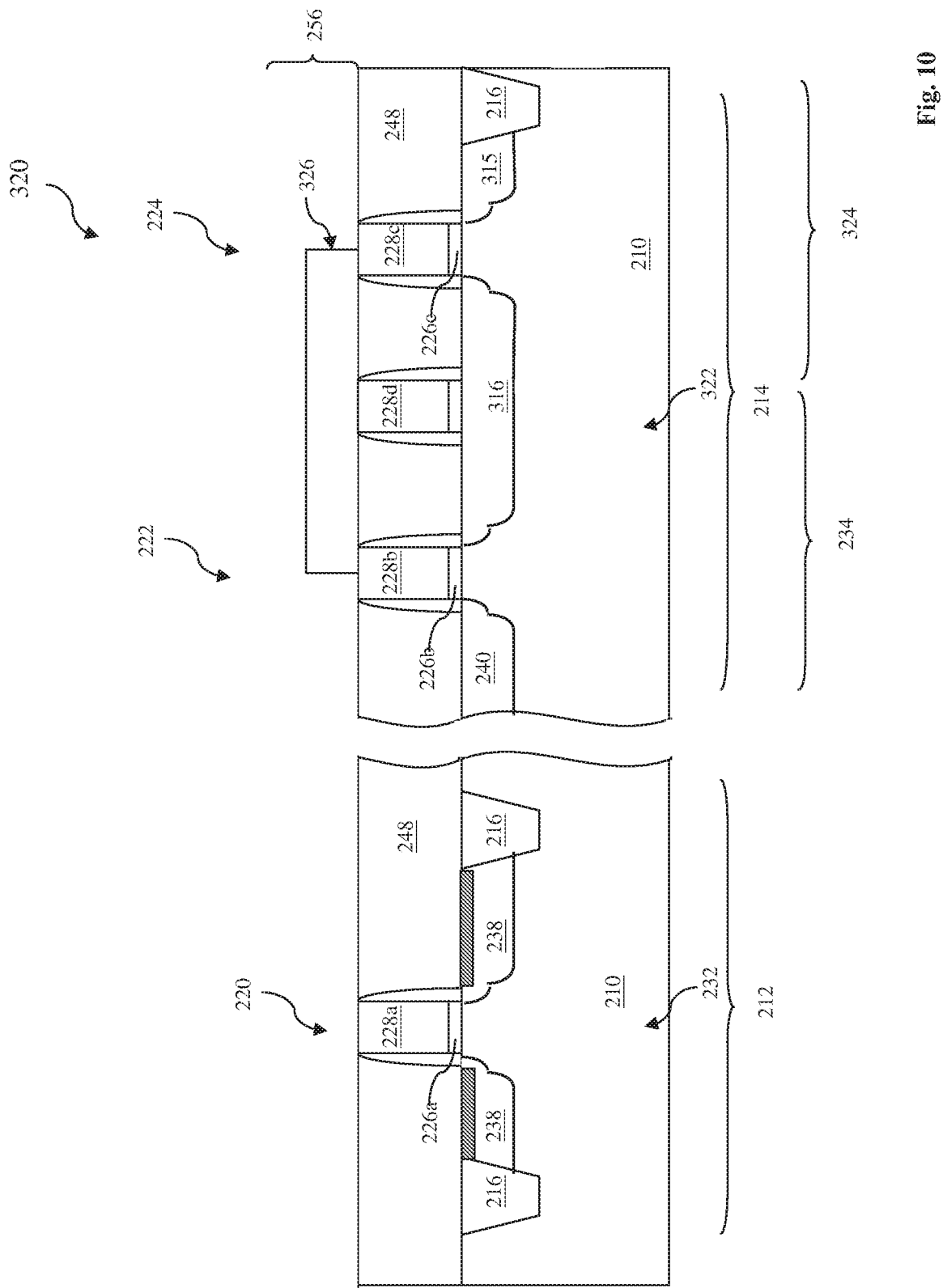

FIG. 10 illustrates another embodiment of a sectional view of a semiconductor structure 320 having a single floating gate non-volatile memory device 322. The semiconductor structure 320 is similar to the semiconductor structure 310 as the single floating gate non-volatile memory device 322 in the memory region 214 is free of silicide. The silicide features 246 are formed on the first transistor 232 in the periphery region 212 for enhanced device performance. However, the single floating gate non-volatile memory device 322 includes a floating gate transistor 234 and another transistor 324 integrated together. The transistor 324 includes a source 315 and a drain 316 disposed on the both side of the gate stack 224. Particularly, the floating gate transistor 234 and the transistor 314 share the common drain 316 interposed between the gate stacks 222 and 224. The common drain 316 and the sources 240 and 315 can be formed simultaneously during a same procedure. In the present embodiment, the semiconductor substrate 210 includes a type of dopant opposite from the type of dopant in the sources 240/315 and the common drain 316. Furthermore, the interconnect structure 256 includes various conductive features 326 configured to connect the gate electrode 228c of the floating gate transistor 234 and the gate electrode 228c of the transistor 324. In one embodiment, the gate electrodes 228b and 228c are directly connected by another gate electrode 228d. The gate electrode 228d is partially disposed on the common drain 316 and extended to the gate electrodes 228b and 228c, respectively, in a suitable configuration.

Figure 11:
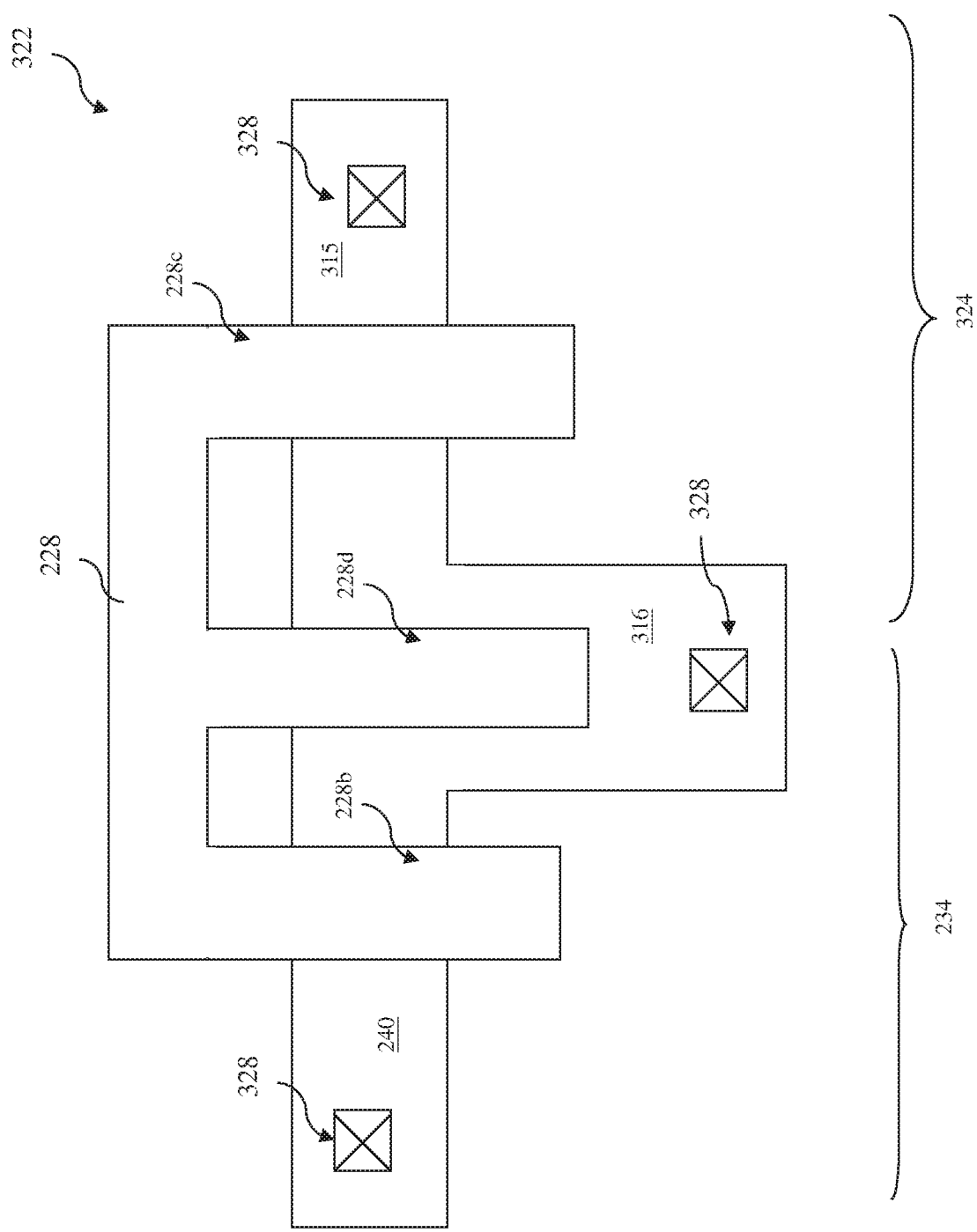
FIGS. 11 and 12 are top views of a semiconductor structure having single floating gate non-volatile memory device constructed according to other embodiments.

In one example illustrated in FIG. 11 as a top view of the single floating gate non-volatile memory device 322, the single floating gate non-volatile memory device 322 includes source 240, source 315 and the common drain 316. The single floating gate non-volatile memory device 322 further includes a gate electrode 228 (and gate dielectric 226 as well, not shown) extended to the floating gate transistor 234 and the transistor 324. The gate electrode 228 includes the first portion 228b disposed on the channel of the floating gate transistor 234, the second portion 228c disposed on the channel of the transistor 324 and the third portion 228d disposed on the common drain 316 configured in a way such that the gate electrodes 228b and 228c are connected. The single floating gate non-volatile memory device 322 further includes various contact 328 disposed and configured for various bias and electrical input.

In another example, the single floating gate non-volatile memory device 312 may be formed in a doped well with a type dopant opposite from the sources (240 and 315) and the common drain 316.

Figure 12:
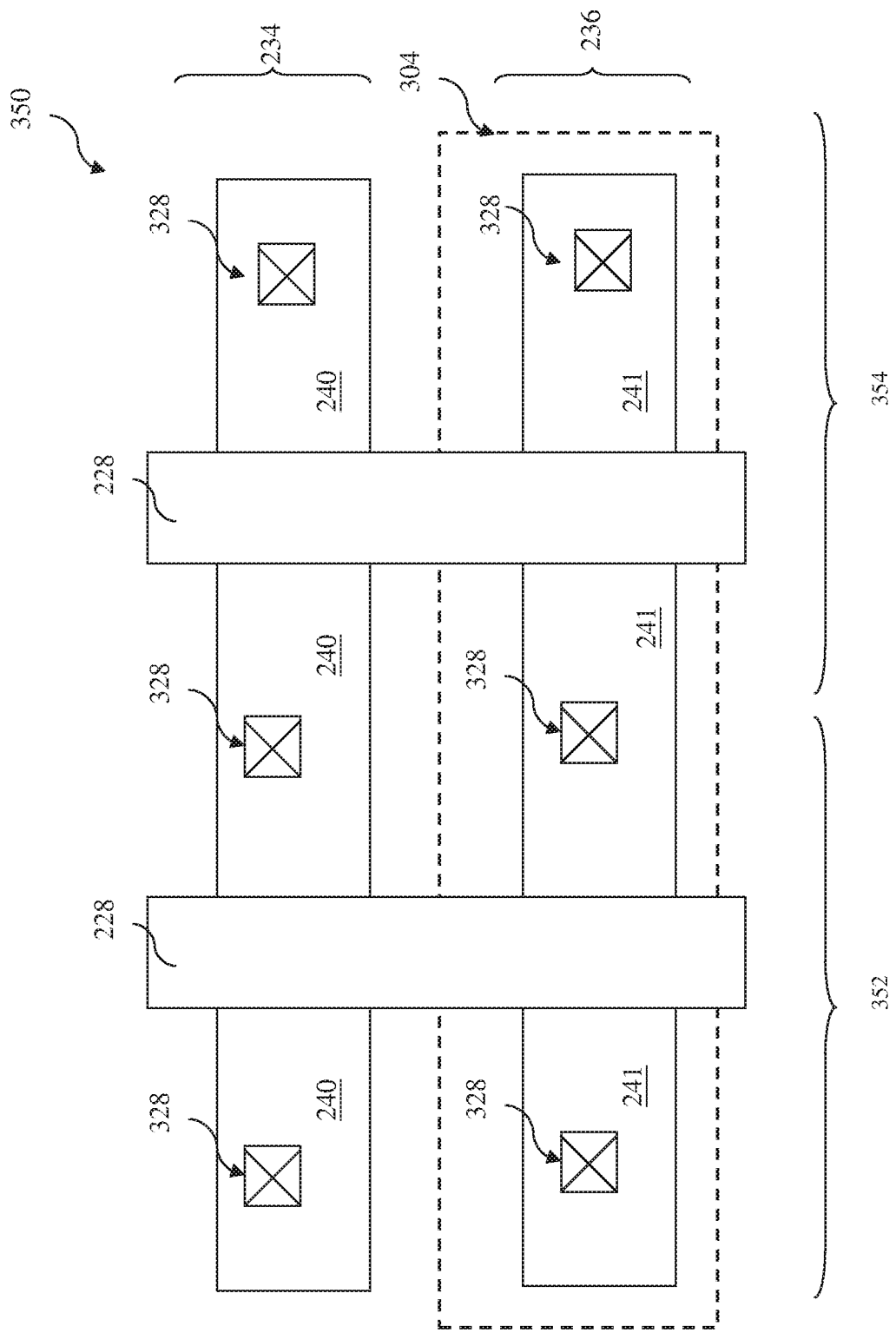

FIG. 12 illustrates a top view of the single floating gate non-volatile memory device 350 constructed according to another embodiment. The single floating gate non-volatile memory device 350 is similar to the single floating gate non-volatile memory device 302 in FIG. 8. The single floating gate non-volatile memory device 350 includes a floating transistor 234 and a capacitor 236 integrated together. In the present embodiment, the single floating gate non-volatile memory device 350 includes two floating gate non-volatile memory cells 352 and 354. The floating gate electrodes 228 are disposed on the channel of the floating gate transistor 234 and extended to the capacitor 236, therefore, the gate stack on the channel of the transistor 234 are directly connected with the gate stack of the capacitor 236 since one floating gate 228 extends over the both. The transistor 234 includes various source and drain 240 and the capacitor 236 includes various doped regions 241. Furthermore, the doped well 304 is formed in the capacitor region and serves as one capacitor electrode. The doped regions 241 and the doped well 304 include a same type of dopant. In one example, the doped well 304 is an n-type doped well (Nwell). The various contact regions in the single floating gate non-volatile memory device 350 are free of silicide.

Figure 13:
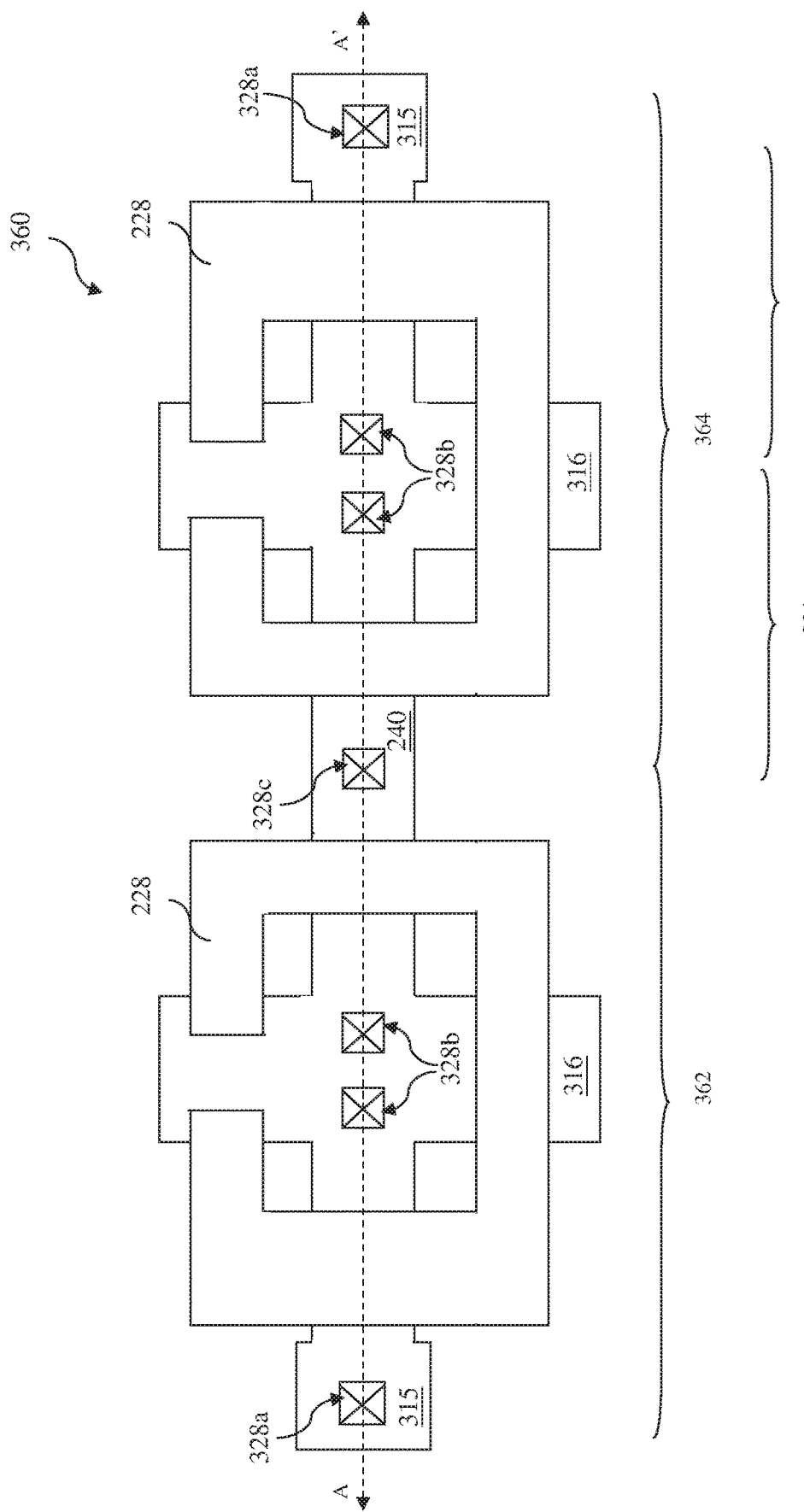
FIG. 13 is a top view of a semiconductor structure having single floating gate non-volatile memory device constructed according to other embodiments.
Figure 14:
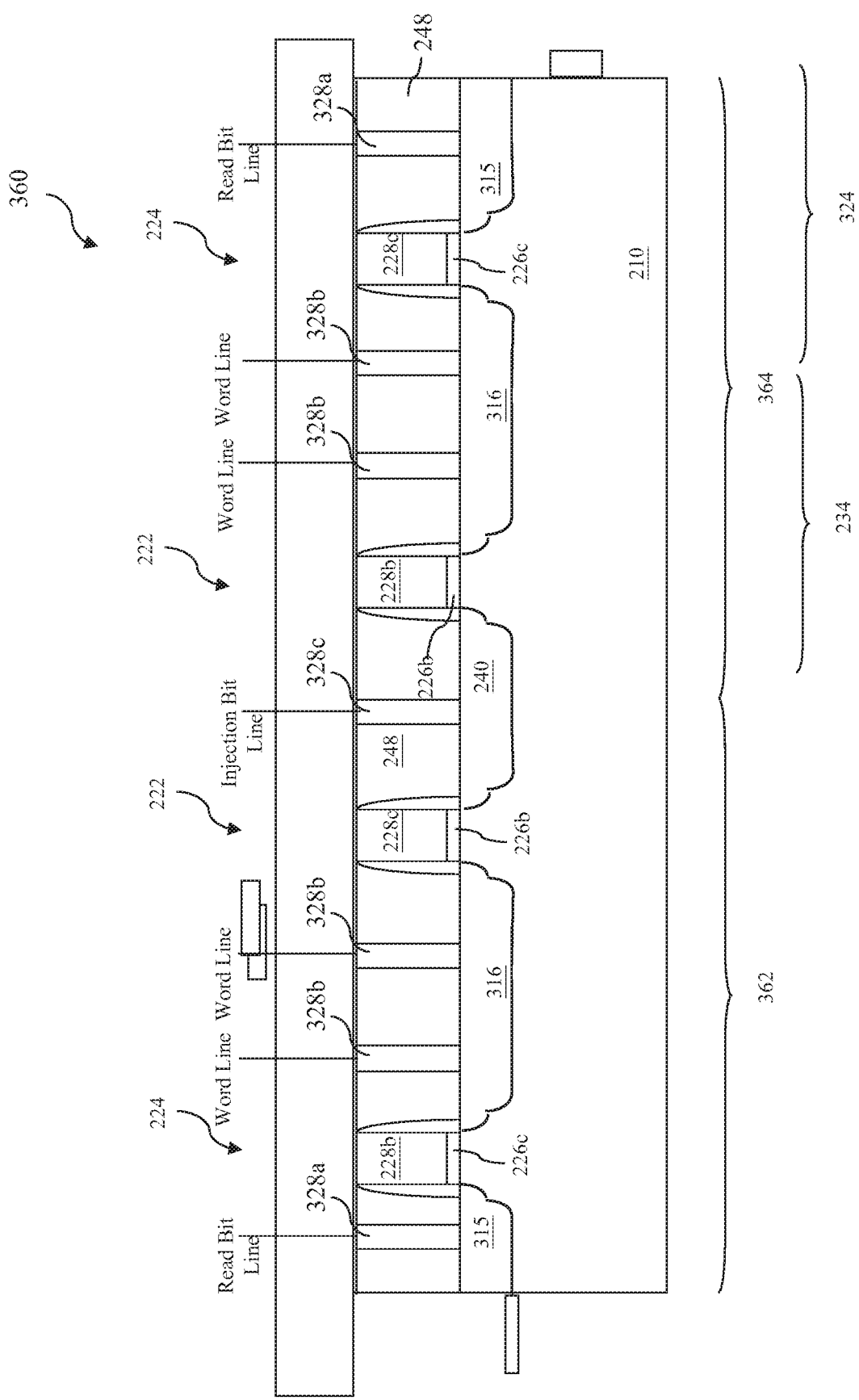
FIG. 14 is a sectional view of the semiconductor structure of FIG. 13 constructed according to other embodiments.

The semiconductor structure having a single floating gate non-volatile memory device is illustrated in various embodiments, such as the semiconductor structure 200 of FIG. 2. The semiconductor structure 200 includes a periphery region and a memory region. The memory region is silicide free and includes one or more single floating gate non-volatile memory devices. The single floating gate non-volatile memory devices may include a different structure, such as one illustrated in FIGS. 13 and 14. FIG. 13 illustrates a top view of a single floating gate non-volatile memory device 360 according to one or more embodiments. FIG. 14 illustrates a sectional view of the single floating gate non-volatile memory device 360 along the line AA' according to one embodiment. The single floating gate non-volatile memory device 360 can be incorporated in the semiconductor structure 200. The single floating gate non-volatile memory device 360 is described with reference with FIGS. 2, 13 and 14.

The single floating gate non-volatile memory device 360 is alternatively or additionally disposed in the memory region 214 that is free of silicide. The single floating gate non-volatile memory device 360 includes a first cell 362 and a second cell 364 as an example. In the single floating gate non-volatile memory device 360, each cell (362 or 364) includes an injection transistor (or first transistor) 234 and a floating gate transistor (or second transistor) 324 integrated together. Taking the second cell 364 as an example, the first transistor 234 includes a source 240 and a drain 316 disposed on both sides of the gate stack 222. The second transistor 324 includes a source 315 and the drain 316 disposed on both sides of the gate stack 224. Particularly, the first and second transistors 234/324 share the common drain 316 interposed between the first gate stack 222 and the second gate stack 224. The common drain 316 and the sources 240/315 can be formed simultaneously during a same procedure. Each gate stack (222 or 224) includes a gate dielectric feature 226 on the substrate 210 and a gate electrode 228 disposed on the corresponding gate dielectric feature 226. In the present embodiment, the gate stacks 222 and 224 in each cell form a continuous gate stack as illustrated in FIG. 13. Accordingly, the gate electrode 228b and 228c are two portions of the continuous gate electrode 228 and are electrically floating.

The single floating gate non-volatile memory device 360 further includes various contact features 328 embedded in the ILD layer 248. The contact features 328 are configured to couple respective source and drain for various bias and electrical input. Each of the sources 240/315 and drains 316 is coupled with one, two or more contact features 328. In one example, each common drain 316 is configured to couple with two contact features 328. In the present embodiment, the source 240 is an injection source and the source 315 is a read source. In furtherance of the present embodiment, the contact feature 328a is coupled to the read source 315 and is further coupled to a read bit line; the contact feature 328b is coupled to the drain 316 and is further coupled to a word line; and the contact feature 328c is coupled to the injection source 240 and is further coupled to an injection bit line.

In various embodiments of the semiconductor structure, the single floating gate non-volatile memory device in the memory region is free of silicide while the transistors (and other devices) in the periphery region include silicide features in various contact regions, such as source/drain and/or gate electrode. Various advantages may be present in one or more embodiments of the present disclosure. If non-silicide contact feature is applied in the whole semiconductor structure, the periphery circuits have degraded performance due to high contact resistance and high gate resistance. If silicide features are formed on the floating gate (no control gate overlying the floating gate in the single floating gate non-volatile memory device), it will degrade the integrity of the floating gate data retention. When the silicide features are formed on the source/drain regions of the single floating gate non-volatile memory device, the design rules including the rule constraining the alignment margins between gate electrode and the silicide feature and the rule constraining the alignment margins between contact plug and the silicide feature will lead to increased cell size and decreased packing density. The disclosed semiconductor structure in various embodiments achieves the increased packing density without sacrifice of the periphery circuit performance and without degrading the integrity of the floating gate data retention.

Other processing steps may be implemented before, during and/or after the formation of the semiconductor structure. For example, the multilayer interconnections are further formed after the step 118. The multilayer interconnection includes vertical interconnects, such as conventional vias, and horizontal interconnects, such as metal lines. The various interconnection features may implement various conductive materials including copper or aluminum. In one example, a damascene process is used to form copper related multilayer interconnection structure.

The present disclosure is not limited to applications in which the semiconductor structure includes a single floating gate non-volatile memory device in the memory region. Although embodiments of the present disclosure have been described in detail, those skilled in the art should understand that they may make various changes, substitutions and alterations herein without departing from the spirit and scope of the present disclosure. For example, the semiconductor structures may additionally include other structure, such as a dynamic random access memory (DRAM) cell, a single electron transistor (SET), field programmable gate-array (FPGA) and/or other microelectronic devices (collectively referred to herein as microelectronic devices). In another embodiment, the semiconductor structure includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, logic cells, and others.

Thus, the present disclosure provides an integrated circuit. The integrated circuit includes a semiconductor substrate having a periphery region and a memory region; a field effect transistor disposed in the periphery region and having silicide features; and a single floating gate non-volatile memory device disposed in the memory region, free of silicide and having a first gate electrode and a second gate electrode laterally spaced from each other.

In one embodiment, the single floating gate non-volatile memory device in the memory region includes a first region and a second region approximate the first region, wherein the first region includes a first structure and the second region includes a second structure. The first structure is designed operable to store charges and includes a first gate dielectric feature over the semiconductor substrate; the first gate electrode disposed on the first gate dielectric feature and configured to be floating; and source and drain formed in the semiconductor substrate, disposed on both sides of the first gate electrode. The second structure is coupled with the first structure for data operations, and includes a second gate dielectric feature over the semiconductor substrate; and the second gate electrode disposed on the second gate dielectric feature.

In another embodiment, the first structure is configured as a transistor with a floating gate coupled with the second gate electrode and the second structure is configured as a capacitor. In yet another embodiment, the second structure further includes a doped well of a first type dopant formed in the semiconductor substrate and underlying the second gate electrode; and a doped contact of the first type dopant formed in the semiconductor substrate and contacting the doped well, wherein the capacitor includes the doped well as a first capacitor electrode, the second gate electrode as a second capacitor electrode, and the second gate dielectric feature as a capacitor dielectric sandwiched between the first and second capacitor electrodes. In yet another embodiment, the second structure further includes a doped well of a first type dopant formed in the semiconductor substrate and underlying the second gate electrode; and a doped contact of a second type dopant formed in the semiconductor substrate and contacting the doped well, the second type dopant being opposite to the first type dopant, wherein the capacitor includes the doped well as a first capacitor electrode, the second gate electrode as a second capacitor electrode, and the second gate dielectric feature as a capacitor dielectric sandwiched between the first and second capacitor electrodes.

In another embodiment, the first structure is configured as a floating gate transistor and the second structure is configured as a select transistor serially connected with the floating gate transistor; the select transistor and the floating gate transistor share the drain. In yet another embodiment, the first structure is configured as a floating gate transistor and the second structure is configured as an injection transistor; the injection transistor and the floating gate transistor share the drain; and the second gate electrode is electrically connected with the first gate electrode. The field effect transistor in the periphery region may include a third gate disposed on a third gate dielectric feature; a source and a drain formed in the semiconductor substrate and interposed by the third gate; and the silicide features formed on the source, drain and the third gate of the field effect transistor in the periphery region, and being further coupled to an interconnect structure for respective electrical bias. The second gate may be electrically connected to the first gate and is electrically floating.

The present disclosure also provides another embodiment of an integrated circuit. The integrated circuit includes a semiconductor substrate having a periphery region and a memory region, wherein the periphery region includes silicide features disposed on various contact areas and the memory region is free of silicide; and a plurality of single floating gate non-volatile memory cells disposed in the memory region. Each of the single floating gate non-volatile memory cells includes a first gate electrode disposed on the semiconductor substrate, separated by a first gate dielectric feature from the semiconductor substrate and configured to be floating for storing charges; a source and a drain formed in the semiconductor substrate, respectively disposed on both sides of the first gate; and a second gate electrode disposed on the semiconductor substrate, separated by a second gate dielectric feature from the semiconductor substrate and laterally distanced from the first gate electrode.

In one embodiment, the second gate electrode is electrically connected with an interconnect structure for electrical bias. The integrated circuit may further include a source in the semiconductor substrate and disposed at an edge of the second gate electrode, wherein the second gate electrode is electrically connected with the first gate electrode and the source at the edge of the second gate electrode is configured operable to charge the first gate electrode. The integrated circuit may further include a first doped region of a first type dopant in the semiconductor substrate and directly underlying the second gate electrode; and a second doped region of the first type dopant in the semiconductor substrate and contacting the first doped region, wherein the second gate electrode is electrically connected with the first gate electrode, and the second doped region is configured operable to charge the first gate electrode. In another embodiment, the single floating gate memory device in the memory region includes a first region and a second region approximate the first region; the first region includes the first gate dielectric feature, the first gate electrode, the source and the drain configured as a transistor; the second region includes a doped well in the semiconductor substrate and directly underlying the second gate dielectric feature, the second gate dielectric feature, and the second gate electrode configured as a capacitor; and the second gate electrode is electrically connected with the first gate electrode. In yet another embodiment, the integrated circuit further include a shallow trench isolation (STI) in the semiconductor substrate and disposed between the drain of the transistor and the doped well.

In yet another embodiment, the integrated circuit further includes a hard mask layer of a first dielectric material on the semiconductor substrate within the memory region; an etch stop layer of a second dielectric material on the semiconductor substrate and partially on the hard mask layer; an inter-level dielectric (ILD) layer of a third dielectric material on the etch stop layer; a first plurality of contact features in the memory region and embedded in the hard mask layer, the etch stop layer and the ILD layer; and a second plurality of contact features in the periphery region, embedded in the hard mask layer, the etch stop layer and the ILD layer and contacting the silicide features. The second dielectric material is different from the first dielectric material and the third dielectric material.

The present disclosure also provides an embodiment of a method of making an integrated circuit. The method includes providing a silicon substrate having a memory region and a periphery region; forming a gate dielectric layer on the silicon substrate and a gate electrode layer on the gate dielectric layer; patterning the gate electrode layer and the gate dielectric layer, resulting in a first gate stack and a second gate stack in the memory region and a third gate stack in the periphery region, the second gate stack being laterally distanced from the first gate stack; performing various implantations to the silicon substrate, forming a first source and a first drain on both sides of the first gate stack and a second source and a second drain on both sides of the third gate stack; and forming a hard mask layer on the silicon substrate, wherein the hard mask layer covers the memory region and exposes the third gate stack, the second source and the second drain in the periphery region; and forming silicide on the third gate stack, the second source and the second drain in the periphery region while the memory region is protected from forming silicide by the hard mask layer.

In one embodiment, forming silicide includes depositing a metal layer on the silicon substrate through the hard mask layer; performing an annealing process to the silicon substrate to react the metal layer with the silicon substrate; and etching to remove un-reacted portion of the metal layer. In another embodiment, after forming silicide, the method further includes forming an inter-level dielectric (ILD) layer on the silicon substrate; etching the ILD layer to form contact holes, respectively aligned with the first source and first drain in the memory region and the second source and the second drain in the periphery region; etching the hard mask layer within the contact holes of the memory region; and forming conductive plugs in the contact holes. In another embodiment, etching the hard mask layer includes implementing an etching process tuned to selectively etch the hard mask layer without significant damage to the silicide within the contact holes of the periphery region. In yet another embodiment, before forming conductive plugs, the method further includes forming an etch stop layer on the silicon substrate before forming an ILD layer such that the etch stop layer is overlying the hard mask layer and the silicide and is underlying the ILD layer; etching the etch stop layer after etching the ILD layer; and thereafter etching the hard mask layer.

In yet another embodiment, the method, before forming conductive plugs, further includes forming an etch stop layer on the silicon substrate before forming an ILD layer such that the etch stop layer is overlying the hard mask layer and the silicide and is underlying the ILD layer; and performing an etching process to the etch stop layer and the hard mask layer after etching the ILD layer, wherein the etching process is tuned to substantially remove the etch stop layer and the hard mask layer without damage to the silicide features.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device comprising:
    a field effect transistor disposed in a periphery region of a substrate, the field effect transistor including a gate electrode, a first source, a first drain; and
    a floating gate non-volatile memory device disposed in a memory region of the substrate, the floating gate non-volatile memory device including:
    a second source, a third source, a fourth source, a second drain, and a third drain disposed along an axis in an order of the third source, the second drain, the second source, the third drain, and the fourth source;
    a first floating gate electrode associated with the second source, the second drain, and the third source in the memory region, the first floating gate electrode including a first portion, a second portion, and a third portion, wherein the first portion, the second portion, and the third portion are electrically connected, wherein the first portion and the third portion extend lengthwise in a direction perpendicular to the axis, wherein the first portion has a physical edge facing a physical edge of the third portion such that the physical edge of the first portion is spaced apart from the physical edge of the third portion, wherein the second portion is disposed between the first and third portions and extends lengthwise along the axis, wherein the second drain extends lengthwise in the direction perpendicular to the axis, wherein the second drain comprises a heavily doped drain feature that includes a bottom surface, wherein a top surface of the substrate is between the bottom surface of the heavily doped drain feature and the first floating gate electrode;
    a first contact disposed directly on the heavily doped drain feature and partially surrounded by the first floating gate electrode in a top view of the device, wherein an extension line from and coplanar with the physical edge of the first portion of the first floating gate electrode extends in the direction perpendicular to the axis and intersects the first contact;
    a second contact disposed directly on the heavily doped drain feature and partially surrounded by the first floating gate electrode in the top view of the device, wherein an extension line from and coplanar with the physical edge of the third portion of the first floating gate electrode extends in the direction perpendicular to the axis and intersects the second contact, wherein the heavily doped drain feature has a first depth directly under the first contact and a second depth directly under the second contact, wherein the first depth equals the second depth; and
    a second floating gate electrode associated with the second source, the third drain, and the fourth source in the memory region, the second floating gate electrode being physically spaced apart from the first floating gate electrode along the axis, wherein the second source is disposed between the first floating gate electrode and the second floating gate electrode with a constant width an entire length between the first floating gate electrode and the second floating gate electrode, the constant width measured in the direction perpendicular to the axis, and wherein each of the third source and the fourth source has a width measured in the direction perpendicular to the axis which is larger than the constant width of the second source.

2. The device of claim 1, further comprising a silicide feature disposed on the first source of the field effect transistor, and
wherein the floating gate non-volatile memory device is free of any silicide feature.

3. The device of claim 1, further comprising an interconnect structure disposed over the floating gate non-volatile memory device, the interconnect structure electrically coupled to the floating gate non-volatile memory device.

4. The device of claim 1, wherein the second portion of the first floating gate electrode physically connects with the first portion of the first floating gate electrode and the third portion of the first floating gate electrode.

5. The device of claim 1, wherein the substrate includes a first type of dopant,
wherein the second source, the third source and the second drain include a second type of dopant that is different from the first type of dopant, wherein the second drain is disposed between the second source and the third source.

6. The device of claim 1, wherein the first portion of the first floating gate electrode is disposed over a first channel region, the first channel region extending between the second source and the second drain, and
wherein the second portion of the first floating gate electrode is disposed over the second drain, and
wherein the third portion of the first floating gate electrode is disposed over a second channel region, the second channel region extending between the third source and the second drain.

7. A device comprising:
a semiconductor substrate having a periphery region and a memory region, wherein the semiconductor substrate includes a top surface;
a field effect transistor disposed in the periphery region; and
a floating gate non-volatile memory device disposed in the memory region, the floating gate non-volatile memory device including a first transistor and a second transistor,
wherein the first transistor includes a first source and a first gate electrode, wherein the second transistor includes a second source and a second gate electrode,
wherein the first source and the second source are disposed along a first axis,
wherein the memory region includes a drain region having a first physical boundary and a second physical boundary that is spaced apart from the first physical boundary in a direction of a second axis substantially perpendicular to the first axis, the drain region extending lengthwise in the direction of the second axis,
wherein the drain region is shared by the first and second transistors,
wherein the first gate electrode and the second gate electrode are electrically coupled to form a continuous gate electrode, such that a portion of the continuous gate electrode physically connects two ends of the first and second gate electrodes while two other ends of the first and second gate electrodes are disjoined, the portion of the continuous gate electrode being disposed along the first axis and disposed over the drain region,
wherein the continuous gate electrode has a top surface that faces away from the top surface of the semiconductor substrate, such that the top surface of the semiconductor substrate is disposed between a bottom surface of the drain region and the top surface of the continuous gate electrode,
wherein the portion of the continuous gate electrode has a first side and a second side opposing the first side, wherein the first and second gate electrodes and the first physical boundary of the drain region are disposed on the first side of the portion of the continuous gate electrode, wherein the second physical boundary of the drain region is disposed on the second side of the portion of the continuous gate electrode, wherein every contact disposed directly above the drain region between the first physical boundary and the second physical boundary is on the first side of the portion of the continuous gate electrode, and
wherein the first source has a constant width an entire length of the first source, the constant width measured in the direction of the second axis, wherein the second source has a width that varies along the first axis, the width of the second source being measured in the direction of the second axis, wherein the width of the second source has a maximum value that is larger than the constant width of the first source.

8. The device of claim 7, wherein the drain region has a first end portion that includes the first physical boundary and an opposing second end portion that includes the second physical boundary, wherein the first end portion and the second end portion have a same size, wherein the portion of the continuous gate electrode is disposed over the second end portion of the drain region, and wherein the continuous gate electrode includes another portion disposed over the first end portion of the drain region.

9. The device of claim 8, wherein the continuous gate electrode extends continuously from over the first end portion of the drain region to over the second end portion of the drain region.

10. The device of claim 7, further comprising:
a first contact disposed directly on the first source; and
an injection bit line coupled to the first contact.

11. The device of claim 10, further comprising:
a second contact disposed directly on the second source; and
a read bit line coupled to the second contact.

12. The device of claim 7, wherein the floating gate non-volatile memory device further includes:
a third transistor that includes the first source and a third gate electrode; and
a fourth transistor that includes a third source and a fourth gate electrode,
wherein the memory region includes a second drain region that is shared by the third and fourth transistors,
wherein the third gate electrode directly interfaces with the fourth gate electrode to form another continuous gate electrode, the another continuous gate electrode including a portion disposed over the second drain region.

13. The device of claim 12, wherein the another continuous gate electrode is physically spaced apart from the continuous gate electrode.

14. The device of claim 7, wherein the second gate electrode is wider than the first gate electrode along the first axis.

15. The device of claim 7, wherein the field effect transistor includes a silicide feature and the floating gate non-volatile memory device is free of any silicide feature.

16. A device comprising:
a field effect transistor disposed in a periphery region of a substrate, the field effect transistor including a gate electrode, a first source, a first drain, wherein the field effect transistor includes silicide; and a floating gate non-volatile memory device disposed in a memory region of the substrate, the floating gate non-volatile memory device including a second source, a second drain, a third source, a third drain, a fourth source, a first floating gate electrode associated with the second source, the second drain, and the third source, and a second floating gate electrode associated with the second source, the third drain, and the fourth source, wherein the second floating gate electrode is physically spaced apart from the first floating gate electrode, wherein the fourth source, a first region of the third drain, the second source, a first region of the second drain, and the third source are disposed sequentially along a first axis, wherein a second region of the second drain adjacent to the first region extends along a second axis perpendicular to the first axis, wherein the second source is disposed lengthwise between the first floating gate electrode and the second floating gate electrode, wherein the second source has a constant width an entire length between the first floating gate electrode and the second floating gate electrode, the constant width measured in the direction of the second axis, wherein each of the third source and the fourth source has a width measured in the direction of the second axis that is larger than the constant width of the second source, wherein the first floating gate electrode includes at least a first portion, a second portion, and a third portion, the first portion being disposed over a first channel region extending from the second source to the first region of the second drain, the second portion being disposed over a second channel region extending from the third source to the first region of the second drain, and the third portion being disposed over the second region of the second drain and configured to electrically connect the first portion to the second portion, and wherein the floating gate non-volatile memory device is free of silicide.

17. The device of claim 16, wherein the second drain further includes a third region adjacent to the first region and extending along the second axis, wherein the first floating gate electrode includes a fourth portion disposed over the third region of the second drain and a fifth portion disposed over the third region of the second drain, and wherein the fourth portion has a terminus end facing a terminus end of the fifth portion such that the terminus end of the fourth portion is spaced apart from the terminus end of the fifth portion.

18. The device of claim 16, wherein the first portion of the first floating gate electrode extends continuously to the third portion of the first floating gate electrode and wherein the second portion of the first floating gate electrode extends continuously to the third portion of the first floating gate electrode.

19. The device of claim 16, further comprising:

a first contact disposed directly on the second source;

an injection bit line coupled to the first contact;

a second contact disposed directly on the third source; and a read bit line coupled to the second contact.

20. The device of claim 16, wherein the substrate includes a first type of dopant, and wherein the second source, the third source, and the second drain include a second type of dopant that is different from the first type of dopant.

\* \* \* \* \*